US006469949B1

(12) United States Patent
Hsu et al.

(10) Patent No.: US 6,469,949 B1
(45) Date of Patent: Oct. 22, 2002

(54) FUSE LATCH ARRAY SYSTEM FOR AN EMBEDDED DRAM HAVING A MICRO-CELL ARCHITECTURE

(75) Inventors: Louis L. Hsu, Fishkill, NY (US); Li-Kong Wang, Montvale, NJ (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 09/854,049

(22) Filed: May 11, 2001

(51) Int. Cl.[7] .................................................. G11C 7/00

(52) U.S. Cl. ............... 365/225.7; 365/201; 365/230.08; 365/189.05

(58) Field of Search ............................. 365/225.7, 201, 365/230.8, 189.05

(56) References Cited

U.S. PATENT DOCUMENTS

| | | | | |
|---|---|---|---|---|
| 3,961,254 | A | | 6/1976 | Cavaliere et al. .............. 324/73 |
| 4,298,980 | A | | 11/1981 | Hajdu et al. .................... 371/25 |
| 5,544,113 | A | * | 8/1996 | Kirihata et al. ............. 365/200 |
| 5,751,727 | A | | 5/1998 | Martens ....................... 371/21.1 |
| 5,859,801 | A | * | 1/1999 | Poechmueller .............. 365/200 |
| 5,991,211 | A | * | 11/1999 | Kato et al. ................... 365/200 |
| 6,016,265 | A | * | 1/2000 | Yoshida et al. ............... 365/96 |
| 6,034,914 | A | * | 3/2000 | Inaba et al. ................ 365/230.6 |
| 6,166,981 | A | * | 12/2000 | Kirihata et al. ........... 365/225.7 |
| 6,211,710 | B1 | * | 4/2001 | Madhu et al. ............... 327/198 |
| 6,272,061 | B1 | * | 8/2001 | Kato et al. ................ 365/225.7 |

* cited by examiner

Primary Examiner—Richard Elms
Assistant Examiner—Tuan T. Nguyen
(74) Attorney, Agent, or Firm—Dilworth & Barrese, LLP

(57) ABSTRACT

A fuse latch array system for an embedded DRAM (eDRAM) having a micro-cell architecture, a wide data bandwidth and wide internal bus width is disclosed for localizing all the fuse information for redundancy replacement purposes. The fuse latch array system includes a fuse latch array having a plurality of memory cells where fuse information is scanned therein sequentially or parallel, or a combination thereof to be compatible with conventional fuse latch scanning protocols, during power-on. When the fuse information is stored in the fuse latch array, it is accessed as a page during a page mode operation. The accessed page contains column redundancy information corresponding to the active bank. The fuse latch array is decoded by row and column, so that the memory cell corresponding to the active bank can be easily located, even if there are thousands of banks within the eDRAM. Once the memory cell corresponding to the active bank is located, the column redundancy information is retrieved for use in identifying the defective column of the active bank using a redundant decoder. If more than one group of datalines are provided for repair, multiple parallel decoding is utilized to locate multiple defective columns simultaneously and replace them simultaneously during a redundancy operation using a conventional multiplexer circuit. The page mode operation of the fuse latch array system ensures the redundancy operation is performed within one clock cycle.

20 Claims, 4 Drawing Sheets

FUSE LATCH ARRAY SYSTEM FOR AN EMBEDDED DRAM HAVING A MICRO-CELL ARCHITECTURE

FIELD OF THE INVENTION

This invention relates to the field of integrated circuit (IC) design. Specifically, it relates to a fuse latch array system for an embedded DRAM (eDRAM) having a micro-cell architecture, a wide data bandwidth and a wide internal bus width.

BACKGROUND OF THE INVENTION

Embedded DRAMs (eDRAMs) with wide data bandwidth and wide internal bus width have been proposed to be used as L2 (level-2) cache to replace pure SRAM cache. Since each DRAM memory cell is formed by a transistor and a capacitor, the size of DRAM cache is significantly smaller than that of SRAM cache. In order to meet performance requirements, DRAMs are made of a plurality of blocks or micro-cells. A block is a small DRAM array unit formed by a plurality of wordlines (e.g., from 64 to 256) and a plurality of bitline pairs (e.g., from 64 to 256). The size of a block is much smaller (e.g., 16× to 256×) than that of a bank of a conventional stand-alone DRAM. Only one block of the eDRAMs is activated each time. The read and write speed of an eDRAM can be fast due to very light loading of wordlines and bitlines.

In order to effectively utilize the large DRAM cache size, a small SRAM unit about the same size of an eDRAM block is used. The SRAM unit serves as a cache interface between an eDRAM and processor(s). The wide internal bus is used for transferring data among eDRAM, SRAM and the processor(s). More specifically, data residing in eDRAM memory cells coupled to a wordline traversing an eDRAM block is transferred to primary sense amplifiers. The data is then transferred to corresponding secondary sense amplifiers. The data is then transferred to the SRAM and stored in the memory cells thereof at the same wordline location. A TAG memory records the block address of the data stored within the SRAM. The data is then transferred to the processor(s).

Generally, neither column addressing nor column decoding is provided for the wide bandwidth eDRAM configuration, since they are not necessary. Hence, a main challenge of the wide bandwidth eDRAM configuration is to provide an effective column redundancy scheme to repair defective column elements without using column addressing. Most of the conventional DRAM approaches require a column address to indicate the location of failed column elements requiring repair.

In a conventional DRAM array, bitline pairs are grouped hierarchically by column address. Only one data bit from a group of bitlines is selected to be transferred via the local and global datalines each time. Therefore, the most common redundancy approach for the conventional DRAM is to provide repair for whole group of bitlines using the column address.

This approach does not lend itself to a wide bandwidth eDRAM, because data from every pair of bitlines of the eDRAM is simultaneously accessed. Further, since all the datalines are coupled to the eDRAM, the data from every pair of bitlines is simultaneously transferred to SRAM; and since all the datalines are coupled to the SRAM, the data from the SRAM is all simultaneously transferred to the processor(s). For such a one-to-one wiring configuration, if any of the datalines fail and no redundancy is offered, the chip must be discarded. If, however, redundancy bitlines are provided in the wide bandwidth eDRAM, it is not easy to correctly replace the failed pair of bitlines without affecting the integrity of the data. Additionally, it is difficult to locate the failed pair of bitlines in the wide bandwidth eDRAM, since, as noted above, column addressing is not available for the wide bandwidth eDRAM.

To overcome the above disadvantages, fuse latch scanning designs have been implemented where, during power-on, all the fuse information, from a fuse bank is scanned into fuse latches or registers, to be used for redundancy replacement. Each fuse latch is typically closely located to the column region for its respective bank. When column address bits are received, a comparison between the incoming address and the stored column address determines whether the DRAM array unit being accessed has to use the redundant elements or not.

The fuse latches are conventional master-slave like shift registers. During power-on, the fuse information containing the failure column address bits are scanned into the shift registers sequentially. The shift registers are decoded (or activated) locally using the corresponding bank addresses. Therefore, in conventional fuse latch array designs, it is preferable that each fuse latch is located in the vicinity of its respective bank.

For a high-performance micro-cell architecture, however, to place fuse latches close to their respective banks is not practical. This is because the size of each bank is very small, and there are a high number of banks. Therefore, a significant area overhead is expected by placing the fuse latches close to their respective banks. It is more practical to localize all the fuse data in a latch array.

Accordingly, a need exists for a fuse latch array system for an eDRAM having a micro-cell architecture, a wide data bandwidth and a wide internal bus width for localizing all the fuse data.

SUMMARY

A major aspect of the present invention is to provide a fuse latch array system for an embedded DRAM (eDRAM) having a micro-cell architecture, a wide data bandwidth and a wide internal bus width for localizing all the fuse data.

Accordingly, a fuse latch array system for an eDRAM having a micro-cell architecture, a wide data bandwidth and wide internal bus width is disclosed for localizing all the fuse data for redundancy replacement purposes. The fuse latch array system includes a fuse latch array having a plurality of memory cells where fuse information is scanned therein sequentially or parallel, or a combination thereof to be compatible with conventional fuse latch scanning protocols, during power-on. Each memory cell includes a master register or latch controlled by complementary clock signals and a slave register or latch.

When the fuse information is stored in the fuse latch array, it is accessed as a page during a page mode operation. The accessed page contains column redundancy information corresponding to the active bank. The fuse latch array is decoded by row and column, so that the memory cell corresponding to the active bank can be easily located, even if there are thousands of banks within the eDRAM.

Once the memory cell corresponding to the active bank is located, the column redundancy information is retrieved for use in identifying the defective column of the active bank. The defective column is identified using a redundant decoder. If more than one group of datalines are provided for repair, multiple parallel decoding is utilized to locate multiple defective columns simultaneously and replace them simultaneously during a redundancy operation using a conventional multiplexer circuit. The page mode operation of the fuse latch array system of the present invention ensures the redundancy operation is performed within one clock cycle.

DETAILED DESCRIPTION OF THE INVENTION

Figure 2:
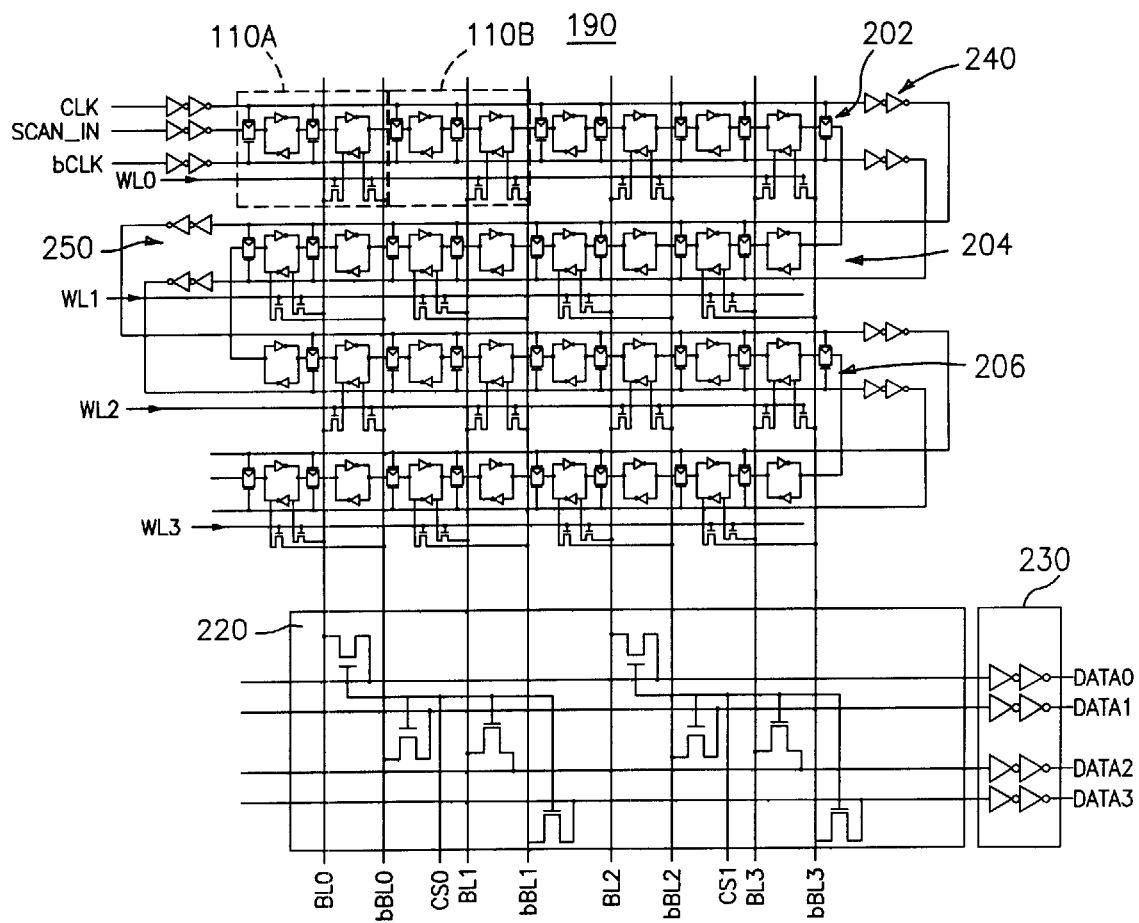
FIG. 2 is a schematic diagram of a fuse latch array of the fuse latch array system according to the present invention.

The present invention provides a fuse latch array system for an embedded DRAM (eDRAM) having a micro-cell architecture, a wide data bandwidth and wide internal bus width for localizing all the fuse data for redundancy replacement purposes. The fuse latch array system includes a fuse latch array having a plurality of memory cells (FIG. 2) where fuse information can be scanned therein sequentially or parallel, or a combination thereof to be compatible with conventional fuse latch scanning protocols, during power-on as described below. In FIG. 2, the fuse latch array is designated by reference numeral 200.

Figure 1:
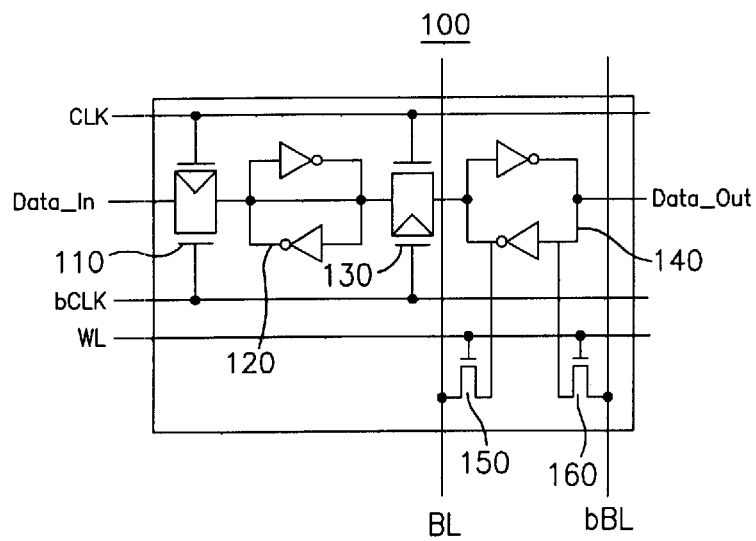
FIG. 1 is a schematic diagram of a memory cell of a fuse latch array system for an eDRAM having a micro-cell architecture according to the present invention.

With reference to FIG. 1, there is shown a schematic diagram of a memory cell of the fuse latch array 200 designated by reference numeral 100. The memory cell 100 includes a master register 120 controlled by complementary clock signal bCLK and a slave register 140 controlled by true clock signal CLK. The complementary clock signals CLK, bCLK are provided for data shifting. The fuse data are shifted from Data_In to the master register 120 via a first transmission gate element 110 during the bCLK high period. The fuse data are then latched into the slave register 140 via a second transmission gate element 130 during the CLK high period. The fuse data are then shifted out to Data_Out to be fed to an adjacent memory cell (not shown) in the same manner. That is, during a subsequent bCLK high period, the fuse data are shifted from the slave register 140 to the master register 120 of the adjacent memory cell. During a subsequent CLK high period, the fuse data are shifted from the master register 120 of the adjacent memory cell to the slave register 140 of the adjacent memory cell.

Once the data is all loaded into the memory cells of the fuse latch array 200, with true and complementary values, the data can be accessed from the slave register 140 by a wordline WL via two transfer gates 150, 160. The data can then be read via a bitline pair, BL and bBL. Sense amplifiers may or may not be needed depending on the size of the fuse latch array 200 and the speed requirement.

With reference to FIG. 2, there is shown a schematic diagram of the fuse latch array 200 of the fuse latch array system according to the present invention. One skilled in the art can appreciate that there are many ways to scan the fuse data into the fuse latch array 190, however, for simplicity purposes, a preferred method is described herein below.

To scan the fuse data into the fuse latch array 190, the clock signals CLK, bCLK and data signal SCAN_IN are scanned in from one memory cell 100 to a next memory cell 100 and from row to row (see the description below in conjunction with FIG. 3). For example, the fuse data are scanned in through the first row 202 from the near-end towards the far-end. When the data reaches the far-end of the first row 202, it shifts to the far-end of the second row 204 and the data is scanned in from the far-end of the second row 204 to the near-end of the second row 204. When the data reaches the near-end of the second row 204, it shifts to the near-end of the third row 206 and the data is scanned in from the near-end of the third row 206 to the far-end of the third row 206, and so on. Once the fuse data are sequentially scanned and loaded into the fuse latch array 190, the fuse data can be checked by performing a random read operation.

Extra buffers 240, 250 are added for the clock signals CLK, bCLK if the fuse latch array 190 is big. Also shown in FIG. 2 are wordlines WL0, WL1, WL2, WL3 and bitlines pairs BL0, bBL0; BL1, bBL1; BL2, bBL2; BL3, bBL3 of the fuse latch array 190. It is provided that additional wordlines and bitline pairs can be included in the fuse latch array 190, as well as additional memory cells 100 (see, for example, FIGS. 3 and 4, where 16 rows of memory cells 100 are provided for the fuse latch array 190), buffers 240, 250 and other components. For example, if the eDRAM has 64 banks and each bank requires two pages of fuse data, then the fuse latch array 190 is implemented to have 32 wordlines and four bitline pairs. According to the embodiment of the fuse latch array system described herein, an incoming bank address contains five row address bits to decode one of 32 wordlines, and one column address bit to select one of two pages.

Bank address bits are used to decode the bank via a row decoder to select one of the wordlines. For instance, the column decoder (not shown) generates CS0 and CS1 based on which fuse page data stored within the fuse latch array 190 is to be retrieved. For example, if wordline WL0 is selected and CS0 is high, then fuse page data from the first two memory cells 110A, 110B are retrieved and sent to data-out signal lines DATA0-3 via a multiplexer circuit 220 and data buffer driver circuit 230. One page provides one fuse information. A bank may have a plurality of fuses to fix a plurality of faulty elements.

Figure 3:
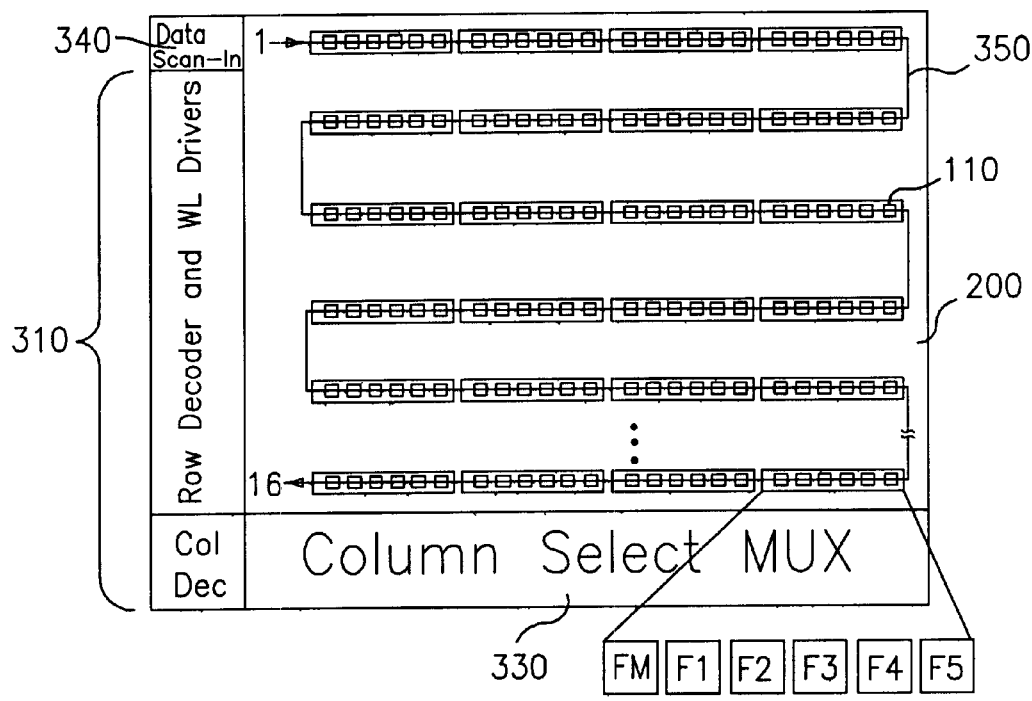
FIG. 3 is a block diagram illustrating a method of scanning fuse data within a fuse latch array according to the present invention.

A more detailed description of data scanning would now be provided with reference to FIG. 3. During power-on, fuse data for each bank are scanned into a fuse latch array 200, which is similar to fuse latch array 190, and stored in specific positions where the data can later be decoded by the bank address (or wordlines). The fuse data, such as address bits indicating dataline(s) (or bitline(s)) needing repair within a corresponding bank, are scanned in from a beginning data scan_in location 340 of a data path 350. The data path 350 for continuously scanning in the fuse data connects all the memory cells 110 sequentially. The order of the fuse data during scanning must be arranged so that after fuse data scanning, the correct order of the fuse data is maintained.

The fuse data can also be scanned in according to a parallel format where each row of memory cells has a respective data scan_in location 340. Accordingly, multiple scan-in entrances and data paths are provided. The advantages of the parallel approach is the high scanning speed due to multiple scan-in entrances and that no data reordering is necessary.

However, the parallel approach requires more overhead, such as the additional data scan_in locations 340.

Row decoder, wordline drivers, and column decoder circuitry 310, and 4:1 column select multiplexer circuitry 330 including the multiplexer circuit 220 and data buffer driver circuit 230 are provided to access the fuse data for each bank during active mode as described above and further below with reference to FIG. 4.

In the fuse latch array system shown by FIG. 3, only one column redundancy replacement is provided for each bank and each replacement requires six bits FM, F1 to F5 to identify the defective column location. The FM bit is a master fuse bit and is stored by the first memory cell 110 of each group of six memory cells 110. Hence, six memory cells 110 are used to store the five bits of fuse data for each bank. The master fuse bit indicates whether the redundant element is being used or not.

Figure 4:
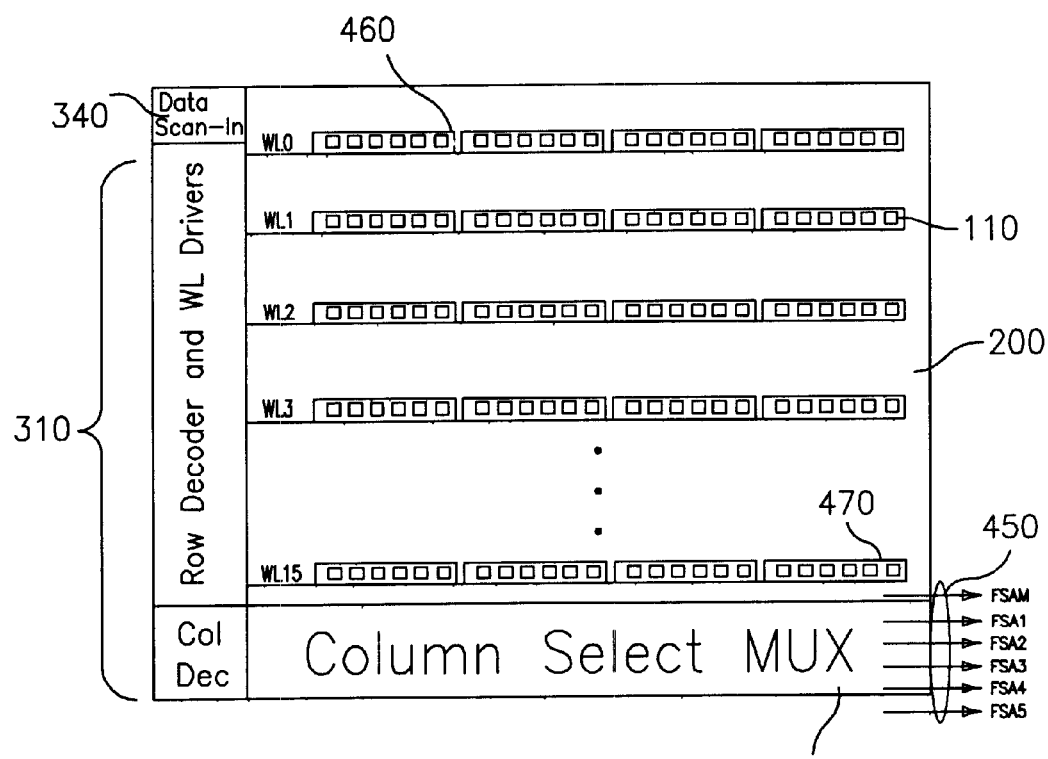
FIG. 4 is a block diagram illustrating a method of storing fuse data within the fuse latch array of FIG. 3 according to the present invention.

With reference to FIG. 4, fuse data storage will now be described. After power-on, as described above, fuse data corresponding to each bank of the eDRAM have been scanned into the fuse latch array 200 and stored in the proper positions. The fuse data corresponding to each bank in the embodiment shown by FIGS. 3 and 4, requires six memory cells 10 for storage within the fuse latch array 200.

As noted above, the first memory cell 110 for each bank stores the master fuse bit. If the master fuse bit is high, it means the redundant element of that bank is being used to replace a faulty element whose address is recorded by the fuse bits. If the master fuse bit is low, it means the bank associated with the master fuse bit has no defective datalines and/or bitlines. The other five bits are used to identify one of the 32 groups of datalines and/or bitlines to be repaired.

With continued reference to FIG. 4, the first six memory cells 460 of the fuse latch array 200 preferably store the fuse data corresponding to the first bank of the first block of the eDRAM and the last six memory cells 470 of the fuse latch array 200 preferably store the fuse data corresponding to the last bank of the last block of the eDRAM.

In a preferred embodiment of the present invention, fuse data corresponding to any particular bank of the eDRAM are accessed by using the bank address bits to decode 64 memory cells 110 within the fuse latch array 200. The bank address bits are fed to row decoders within the row decoder, wordline drivers, and column decoder circuitry 310 to decode one of four banks to select one of 16 four-bank groups (i.e., blocks) to obtain the particular cells 110, in a manner as known in the art.

After the proper wordline is selected, i.e., the wordline traversing through the six memory cells 110 storing fuse data corresponding to the particular bank, a column decoder within the row decoder, wordline drivers, and column decoder circuitry 310 and the 4:1 column select multiplexer circuitry 330 are used to select a column within the array 200 having the six memory cells 110 storing fuse data corresponding to the particular bank of the decoded four-bank group. Since the array 200 contains four columns of six memory cell groups, two address bits are inputted to the column decoder.

A page mode operation is then performed to simultaneously read all the fuse data of the six memory cells 110 corresponding to the particular block. The fuse data are simultaneously read and outputted from the fuse latch array 200 via data lines FSAM and FSA1 to FSA5. The fuse data are read within one clock cycle. The data line FSAM outputs the master fuse bit and the data lines FSA1 to FSA5 output the five non-master fuse bits.

It is noted that the fuse latch array 190 illustrated by FIG. 2 is slightly different than the fuse latch array 200 illustrated by FIGS. 3 and 4. In fuse latch array 190, each row is capable of storing four fuse bits, and in fuse latch array 200, each row is capable of storing the fuse latch array 200 illustrated by FIGS. 3 and 4. In fuse latch array 190, each row is capable of storing four fuse bits, and in fuse latch array 200, each row is capable of storing 24 fuse bits.

Figure 5:
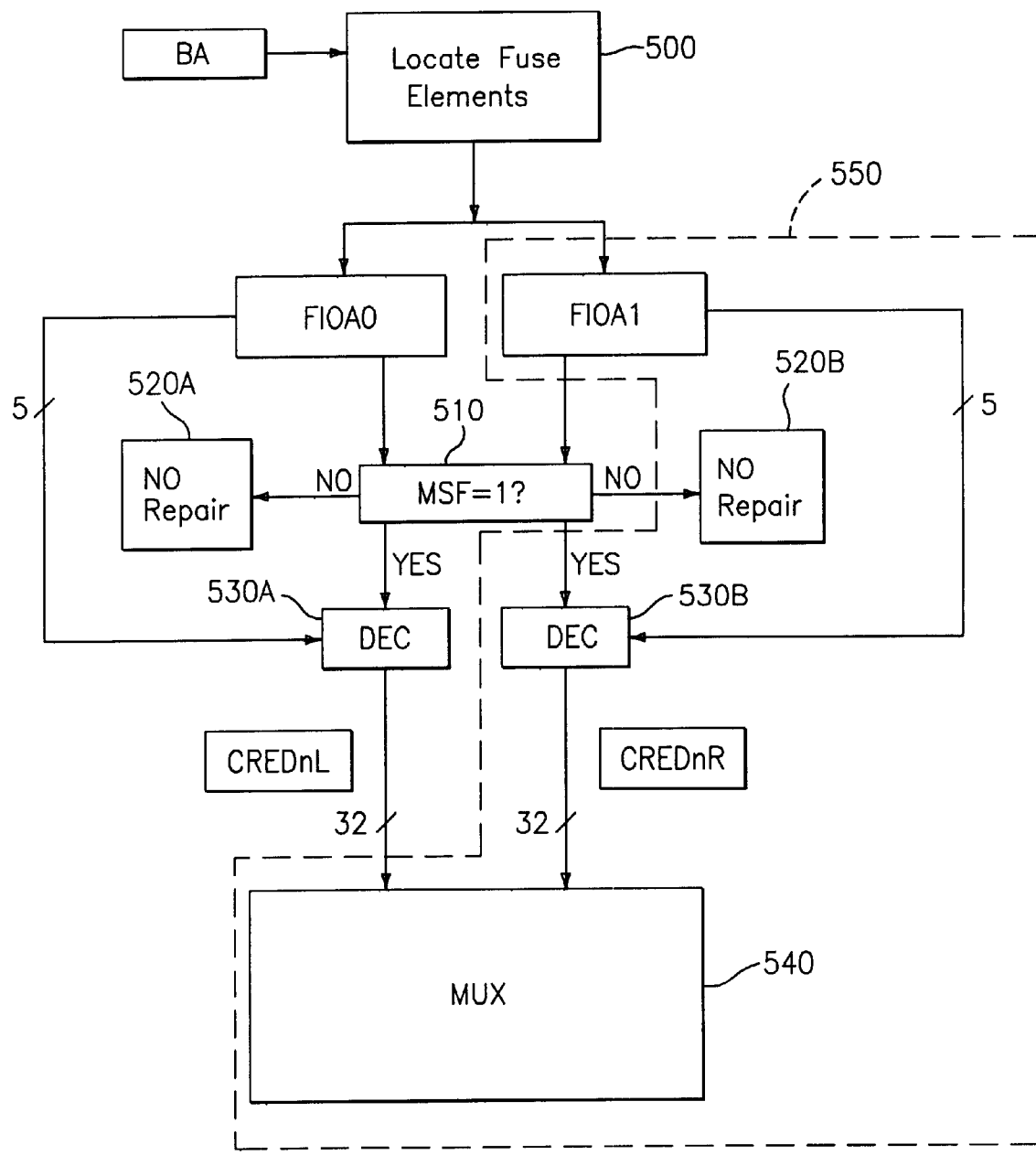
FIG. 5 is a flow chart-type block diagram illustrating a redundancy replacement method for an eDRAM having a micro-cell architecture, a wide data bandwidth and a wide internal bus width using a fuse latch array system according to the present invention.

FIG. 5 illustrates a flow chart-type block diagram of a redundancy replacement method for an eDRAM having a micro-cell architecture, a wide data bandwidth and a wide internal bus width using a fuse latch array system according to the present invention. In block 500, the memory elements 110 storing the fuse data are located within a fuse latch array, which is similar to fuse latch array 200, using the bank address BA containing the row address bits and at least one column address bit.

In the flow chart, two fuse data sets FIOA0 and FIOA1 are retrieved simultaneously, since the fuse latch array system in which the redundancy replacement method illustrated by FIG. 5 is utilized, uses two fuse elements per bank. If only one fuse element per bank is used, as is the case with the fuse latch array 200, then the section blocked off in FIG. 5 and referenced by reference numeral 550 would not be necessary. One skilled in the art can appreciate that FIG. 5 can be expanded to have additional sections identical to the section reference by reference numeral 550 for fuse latch array systems using more than two fuses elements per bank.

The master fuse bits MSFs of each of the two fuse data sets FIOA0 and FIOA1 are checked in block 510. If none of the master fuse bits MSFs have a high logic state, then no replacement of datalines is required as indicated by blocks 520A, 520B. If one or both of the master fuse bits MSFs have a high logic state, i.e., MSF=1, then the rest of the five fuse bits corresponding to the master fuse bit(s) MSF(s) having a high logic state are used by a corresponding 32:1 decoder 530A, 530B to decode and select one of the 32 groups of datalines to be replaced using a conventional multiplexer circuit 540. It is appreciated that a processor executing a set of instructions checks the logic state of the master fuse bit and determines if dataline replacement is necessary.

Figure 6:
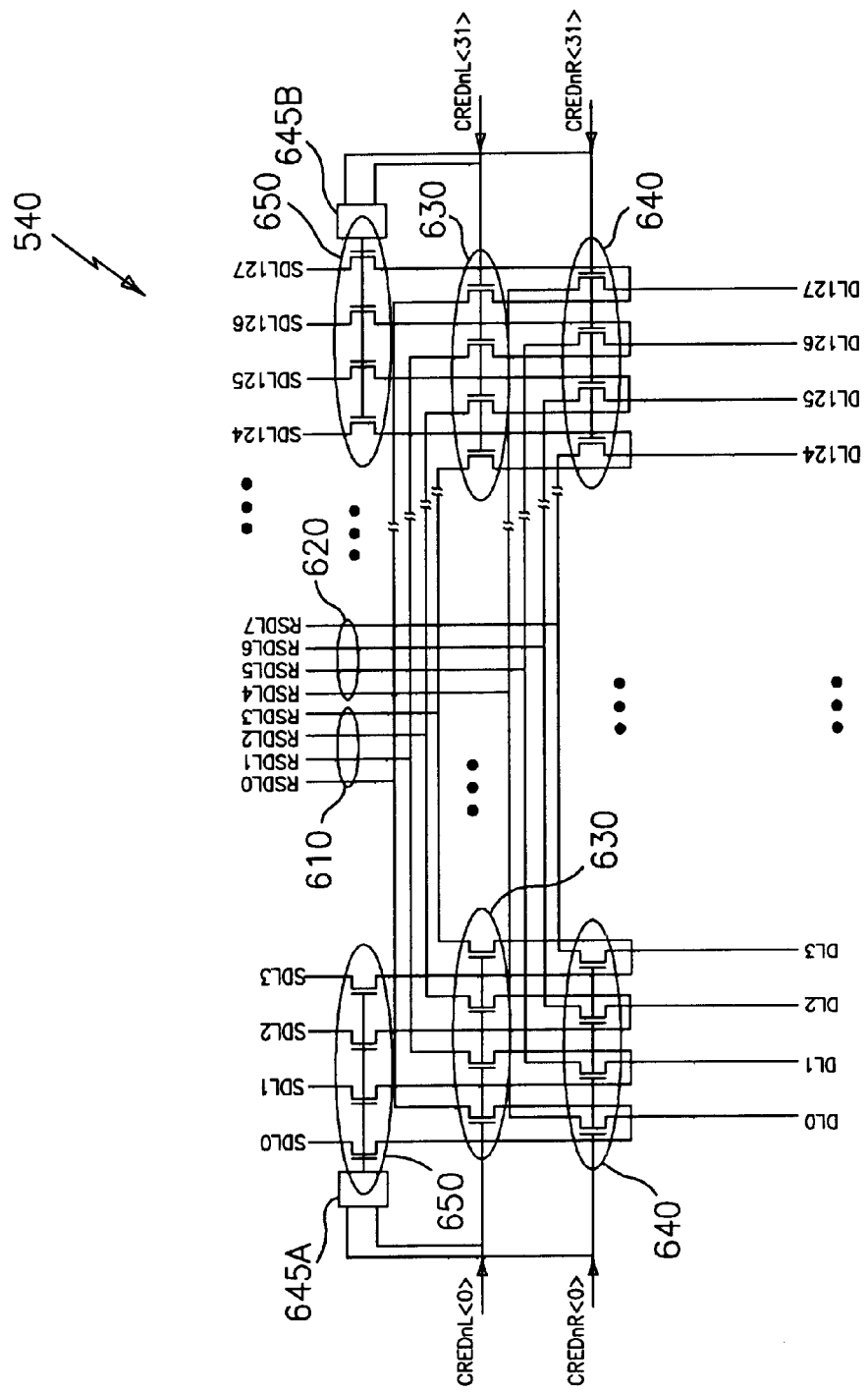
FIG. 6 is a prior art multiplexer circuit for swapping any one of two groups of four redundant datalines with any one of 32 groups of four defective datalines utilizing information stored within the fuse latch array of the fuse latch array system according to the present invention.

An exemplary dataline replacement operation will now be explained with reference to FIG. 6. FIG. 6 illustrates the prior art multiplexer circuit 540 for swapping any one of two groups 610, 620 of four redundant datalines with any one of 32 groups 650 of four defective datalines utilizing information stored within the fuse latch array of the fuse latch array system according to the present invention.

The output of the first 32:1 decoder 530A generates a first set of 32 signals, i.e., CREDnL<0> to CREDnL<31>. These signals activate at most one of 32 transistors or switches 630 for dataline replacement. Similarly, the output of the second 32:1 decoder 530B generates a second set of 32 signals, i.e., CREDnR<0> to CREDnR<31>. These signals activate at most one of 32 transistors or switches 640 for dataline replacement. Within a group of four datalines, if no repairing is called for, of if both CREDnR and CREDnL are low, then the NOR gates 645A, 645B will switch on the main switch group of transistors 650 to short the sense amplifier datalines SDL0-SDL127 to the datalines DL0-DL127 without using the redundancy datalines RSDL0-RSDL7.

The fuse latch array 200 described herein is just one example of a fuse latch array for incorporation within the fuse latch array system according to the present invention. It is appreciated that one skilled in the art from the description provided herein can implement and operate a fuse latch array system having a fuse latch array with many more memory cells, wordlines, bitlines, etc. For example, one skilled in the art can provide a fuse latch array system where eight bits are needed to decode one of 128 groups of datalines and/or bitlines; the first bit being for the master fuse bit. In such a system, it is apparent that a different number of row and column decoders would be needed for the row decoder, wordline drivers, and column decoder circuitry 310.

It is also to be appreciated by one skilled in the art that the fuse data scanning and storage operations, as well as the redundancy replacement operations described above with reference to FIG. 6, are controlled by a processor executing a set of programmable instructions which are stored in a memory.

In conclusion, the present invention provides a fuse latch array system designed to store fuse data for column redundancy applications for a high performance micro-cell DRAM architecture. The fuse latch array system includes a fuse latch array having a plurality of memory cells where fuse data can be scanned therein sequentially or parallel, or a combination thereof to be compatible with conventional fuse latch scanning protocols, during power-on. When the fuse data are stored in the fuse latch array, the bank address is used to retrieve the column redundancy information from the fuse latch array.

The fuse data are accessed as a page during a page mode operation. The accessed page contains column redundancy information corresponding to the active bank. The fuse latch array is decoded by row and column, so that the memory cell corresponding to the active bank can be easily located and retrieved in high speed, even if there are thousands of banks within the eDRAM. Once the memory cell corresponding to the active bank is located, the column redundancy information is retrieved for use in identifying the defective column of the active bank using a redundant decoder. If more than one group of redundant datalines are provided for repair, multiple parallel decoding is utilized to locate multiple defective columns simultaneously and replace them simultaneously during a redundancy operation using a conventional multiplexer circuit. The page mode operation of the fuse latch array system ensures the redundancy operation is performed within one clock cycle.

What has been described herein is merely illustrative of the application of the principles of the present invention. For example, the systems described above and implemented as the best mode for operating the present invention are for illustration purposes only. As a particular example, for instance, other design configurations may be used for the fuse latch array system which provide similar operation as the system described herein. In other words, other arrangements and methods may be implemented by those skilled in the art without departing from the scope and spirit of this invention.

We claim:

1. A fuse latch array system for storing fuse data for column redundancy applications for an embedded DRAM (eDRAM) system, the fuse latch array system comprising:
   a plurality of fuse latch elements arranged in an array and having a plurality of bitlines traversing there through;
   an data input line coupled to at least one of the plurality of fuse latch elements for inputting fuse data to the fuse latch array for storage therein;
   a plurality of data connection lines each connecting adjacent fuse latch elements of the plurality of fuse latch elements for passage of fuse data there between; and
   at least one clock signal line for inputting at least one clock signal to the fuse latch array for shifting fuse data within adjacent fuse latch elements via the plurality of data connection lines and within each of the plurality of fuse latch elements.

2. The system according to claim 1, further comprising:
   a multiplexer circuit coupled to the plurality of fuse latch elements for accessing fuse data; and
   a plurality of data output lines coupled to the multiplexer circuit for outputting the fuse data.

3. The system according to claim 1, further comprising buffers connecting a first group of fuse latch elements of the plurality of fuse latch elements with a second group of fuse latch elements of the plurality of fuse latch elements.

4. The system according to claim 3, wherein the first group of fuse latch elements are arranged in a first row of the array and the second group of fuse latch elements are arranged in a second row of the array.

5. The system according to claim 1, wherein fuse data is stored in the array sequentially starting from the at least one fuse latch element of the plurality of fuse latch elements which is coupled to the data input line.

6. The system according to claim 1, wherein each of the plurality of fuse latch elements includes a master latch and a slave latch coupled via a transmission gate.

7. The system according to claim 6, wherein, during a first clock period of a first clock signal of the at least one clock signal, fuse data are shifted to the master latches of each of the plurality of fuse latch elements, and, during a first clock period of a second clock signal of the at least one clock signal, fuse data are shifted to the slave latches of each of the plurality of fuse latch elements.

8. The system according to claim 7, wherein, during a second clock period of the first clock signal of the at least one clock signal, fuse data are shifted from the slave latches to the master latches of adjacent fuse latch elements of the plurality of fuse latch elements, and, during a second clock period of the second clock signal of the at least one clock signal, fuse data are shifted to the slave latches of each of the plurality of fuse latch elements.

9. The system according to claim 1, wherein fuse data corresponding to a bank of the eDRAM are read from the array by using a bank address corresponding to the bank.

10. The system according to claim 9, wherein the bank address includes a master fuse bit and a plurality of data bits for identifying a defective column location within the bank.

11. The system according to claim 10, wherein the master fuse bit and the plurality of data bits corresponding to the bank are stored within a group of fuse latch elements of the plurality of fuse latch elements, and wherein each of the group of fuse latch elements stores one of the master fuse bit and one of the plurality of data bits.

12. The system according to claim 1, wherein fuse data stored within a group of fuse latch elements corresponding to a bank of the eDRAM are simultaneously read from the group of fuse latch elements of the plurality of fuse latch elements.

13. The system according to claim 1, wherein fuse data stored within a group of fuse latch elements corresponding to a bank of the eDRAM are read via a page mode operation from the group of fuse latch elements of the plurality of fuse latch elements.

14. The system according to claim 1, wherein fuse data stored within a group of fuse latch elements corresponding to a bank of the eDRAM are read within one clock cycle from the group of fuse latch elements of the plurality of fuse latch elements.

15. The system according to claim 1, further comprising decoder circuitry for receiving a bank address corresponding to a bank of the eDRAM and decoding one of a plurality of wordlines traversing the array for locating at least one group of fuse latch elements of the plurality of fuse latch elements corresponding to the bank address and storing fuse data corresponding to the bank.

16. The system according to claim 15, further comprising means for checking a master fuse bit stored within the at least one group of fuse latch elements and determining if a dataline replacement operation is necessary.

17. The system according to claim 16, wherein the dataline replacement operation is necessary if the master fuse bit has logic high state.

18. The system according to claim 16, further comprising at least one decoder for receiving fuse latch bits stored within the at least one group of fuse latch elements and outputting a set of signals for activating at least one of a plurality of switches of a multiplexer circuit if the dataline replacement operation is necessary.

19. The system according to claim 1, wherein the plurality of fuse latch elements are located in proximity to banks of the eDRAM.

20. The system according to claim 1, further comprising a data path originating at the data input line and sequentially connecting the plurality of fuse latch elements.

* * * * *